United States Patent
Imai et al.

(10) Patent No.: US 10,145,865 B2
(45) Date of Patent: Dec. 4, 2018

(54) NON-CONTACT VOLTAGE MEASUREMENT DEVICE

(71) Applicant: OMRON CORPORATION, Kyoto-shi, Kyoto (JP)

(72) Inventors: Hiroshi Imai, Nara (JP); Keiki Matsuura, Nara (JP); Hiroyuki Tokusaki, Kasugai (JP); Mao Ogimoto, Hirakata (JP); Goro Kawakami, Kusatsu (JP); Kohei Tomita, Kyoto (JP); Atsuhiro Okamura, Kusatsu (JP)

(73) Assignee: OMRON CORPORATION, Kyoto-shi (JP)

( * ) Notice: Subject to any disclaimer, the term of this patent is extended or adjusted under 35 U.S.C. 154(b) by 0 days.

(21) Appl. No.: 15/122,545

(22) PCT Filed: Feb. 4, 2015

(86) PCT No.: PCT/JP2015/053148
§ 371 (c)(1),
(2) Date: Aug. 30, 2016

(87) PCT Pub. No.: WO2015/137017
PCT Pub. Date: Sep. 17, 2015

(65) Prior Publication Data
US 2017/0067939 A1    Mar. 9, 2017

(30) Foreign Application Priority Data
Mar. 13, 2014    (JP) ................. 2014-050654

(51) Int. Cl.
*G01R 15/16*    (2006.01)
*G01R 1/07*    (2006.01)

(52) U.S. Cl.
CPC .......... *G01R 15/16* (2013.01); *G01R 15/165* (2013.01); *G01R 1/07* (2013.01)

(58) Field of Classification Search
None
See application file for complete search history.

(56) References Cited

U.S. PATENT DOCUMENTS 3,182,257 A * 5/1965 Linkowski ......... G01R 1/06788
324/149
3,621,392 A 11/1971 Liebermann et al.
(Continued)

FOREIGN PATENT DOCUMENTS

JP    2005-127784 A    5/2005
JP    2005-214689 A    8/2005
(Continued)

OTHER PUBLICATIONS

International Search Report of PCT/JP2015/053148 dated Apr. 21, 2015, (one page).
(Continued)

*Primary Examiner* — Paresh H Patel
(74) *Attorney, Agent, or Firm* — Metrolexis Law Group, PLLC (57) ABSTRACT

Provided is a non-contact voltage measuring device capable of measuring, with given accuracy, measurement target voltages applied to various conducting wires having respective different shapes. An inner electrode which is deformable depending on a shape of a wire "w" is electrically connected, via a connecting section, to an outer electrode fixed to an electric field shield.

1 Claim, 9 Drawing Sheets

(56) References Cited

U.S. PATENT DOCUMENTS

| | | | |
|---|---|---|---|
| 4,090,130 A | | 5/1978 | Willenbecher, Jr. |
| 5,473,244 A | * | 12/1995 | Libove .................... G01R 1/22 |
| | | | 324/126 |
| 5,512,838 A | * | 4/1996 | Roach ................ G01R 1/06711 |
| | | | 324/149 |
| 7,902,854 B2 | * | 3/2011 | Gunn ....................... H02G 7/00 |
| | | | 324/754.01 |
| 2002/0097056 A1 | | 7/2002 | Blades |

FOREIGN PATENT DOCUMENTS

| | | |
|---|---|---|
| JP | 2006-030141 A | 2/2006 |
| JP | 2009-41925 A | 2/2009 |
| JP | 2010-008333 A | 1/2010 |
| JP | 2012-137496 A | 7/2012 |
| JP | 2012-163394 A | 8/2012 |

OTHER PUBLICATIONS

The English translation of the international preliminary report on patentability (Chapter I) of PCT/JP2015/053148 mailed by the International Bureau of WIPO dated Sep. 22, 2016.
The extended European search report (EESR) dated Oct. 9, 2017 in a counterpart European patent application.

* cited by examiner

NON-CONTACT VOLTAGE MEASUREMENT DEVICE

TECHNICAL FIELD

The present invention relates to a non-contact voltage measuring device which measures, without being in contact with a conductor, a voltage that causes an alternating current to flow through the conductor.

BACKGROUND ART

Conventionally, non-contact voltage measuring devices have been disclosed which measure a voltage (measurement target voltage) that causes an alternating current to flow through a conducting wire contained in a wire subjected to insulating coating, without being in contact with the conducting wire.

Generally, a non-contact voltage measuring device includes a probe and an electric circuit. In a case where the probe is brought closer to a wire so that a coupling capacitance is formed between the probe and the wire, a measurement target voltage is derived in accordance with a voltage signal supplied to the electric circuit via the probe. An electric field shield for shielding the electric circuit from an external electric field is provided around the electric circuit.

Generally, as the probe becomes closer to the wire, a capacitance value of the coupling capacitance becomes higher. This causes an improvement in accuracy of measurement of the measurement target voltage. Therefore, the probe is preferably provided as close as possible to a surface of the wire. Furthermore, the non-contact voltage measuring device is preferably capable of measuring measurement target voltages applied to various wires having respective different diameters.

However, according to such a conventional non-contact voltage measuring device, it is sometimes not possible to bring the probe sufficiently closer to the wire, depending on a diameter of the wire. In this case, the capacitance value of the coupling capacitance becomes lower, and accordingly the accuracy of the measurement of the measurement target voltage becomes lower.

CITATION LIST

Patent Literatures

Patent Literature 1

Japanese Patent Application Publication Tokukai No. 2010-8333 (Publication date: Jan. 14, 2010)

Patent Literature 2

Japanese Patent Application Publication Tokukai No. 2012-137496 (Publication date: Jul. 19, 2012)

Patent Literature 3

Japanese Patent Application Publication Tokukai No. 2009-41925 (Publication date: Feb. 26, 2009)

SUMMARY OF INVENTION

Technical Problem

In view of the above, it is considered to configure the probe such that the probe is so deformable as to be brought sufficiently closer to the wire, regardless of the diameter of the wire.

However, according to the above non-contact voltage measuring device, in a case where the probe is deformed, a positional relationship between the probe and the electric field shield is changed. This causes a variation in capacitance value of a parasitic capacitance formed between the probe and the electric field shield. Such a variation in capacitance value of the parasitic capacitance is problematic because the variation adversely affects the accuracy of the measurement of the measurement target voltage.

Note that none of Patent Literatures 1 through 3 discloses a probe which is deformable depending on a shape of a wire. Therefore, according to a non-contact voltage measuring device disclosed in each of Patent Literatures 1 through 3, there is a possibility that a capacitance value of a coupling capacitance becomes lower depending on a shape of a wire and, as a result, accuracy of measurement of a measurement target voltage becomes lower.

The present invention has been made in view of the above problem, and an object of the present invention is to provide a non-contact voltage measuring device capable of measuring, with given accuracy, measurement target voltages applied to various conducting wires having respective different shapes.

Solution to Problem

In order to attain the above object, a non-contact voltage measuring device in accordance with an aspect of the present invention is a non-contact voltage measuring device for measuring a measurement target voltage applied to a conductor, including: a probe; an electric circuit; and an electric field shield which covers at least part of the electric circuit so as to shield the electric circuit from an electric field incident on the electric circuit, the probe being deformable depending on a shape of the conductor, the probe causing a capacitance value of a parasitic capacitance formed between an electrode of the probe and the electric field shield to be maintained at a given level, the measurement target voltage being measured in accordance with a voltage signal supplied to the electric circuit via the probe in a case where the probe is brought closer to the conductor, without being in contact with the conductor, so that a coupling capacitance is formed between the electrode of the probe and the conductor.

According to the above configuration, the electrode included in the probe is deformable. Specifically, the electrode can be deformable so as to be close contact with an outer coating of a conducting wire (conductor). Further, even in a case where the electrode is deformed, the probe causes a capacitance value of a parasitic capacitance formed between the electrode and the electric field shield to be maintained at a given level.

Generally, an effect of a parasitic capacitance, formed between an electrode of a probe and an electric field shield, on accuracy of measurement of a measurement target voltage is eliminated by calibration. However, according to a conventional configuration, in a case where a degree of deformation of an electrode is changed, a distance between the electrode and an electric field shield is also changed. As a result, a capacitance value of a parasitic capacitance formed between the electrode and the electric field shield is also changed. Therefore, according to the conventional configuration, there is a problem that accuracy of measurement of a measurement target voltage is changed depending on a degree of deformation of the electrode.

In contrast, according to the above configuration, even in a case where a degree of deformation of the probe is changed, a capacitance value of a parasitic capacitance formed between the electrode and the electric field shield is not changed.

It is therefore possible to measure, with given accuracy, measurement target voltages applied to various conducting wires having respective different diameters.

Advantageous Effects of Invention

According to the present invention, it is possible to measure, with given accuracy, measurement target voltages applied to various conductors having respective different shapes.

BRIEF DESCRIPTION OF DRAWINGS

(a) of FIG. 4 are contour plots each illustrating a result of simulating electric potentials generated in the voltage measuring device in accordance with Embodiment 1 of the present invention. (b) of FIG. 4 are contour plots each illustrating a result of simulating electric potentials generated in a voltage measuring device in accordance with a reference example.

(a) of FIG. 5 is a graph illustrating electric potentials in ranges indicated by respective broken lines illustrated in (a) of FIG. 4. (b) of FIG. 5 is a graph illustrating electric potentials in ranges indicated by respective broken lines illustrated in (b) of FIG. 4.

(a) of FIG. 6 are contour plots each illustrating a result of simulating electric fields generated in the voltage measuring device in accordance with Embodiment 1 of the present invention. (b) of FIG. 6 are contour plots each illustrating a result of simulating electric fields generated in the voltage measuring device in accordance with the reference example.

(a) of FIG. 7 is a graph illustrating electric fields in ranges indicated by respective broken lines illustrated in (a) of FIG. 6. (b) of FIG. 7 is a graph illustrating electric fields in ranges indicated by respective broken lines illustrated in (b) of FIG. 6.

DESCRIPTION OF EMBODIMENTS

Embodiment 1

The following description will discuss, in detail, Embodiment 1 of the present invention with reference to FIGS. 1 through 7.

[Configuration of Non-Contact Voltage Measuring Device 1]

Figure 1:
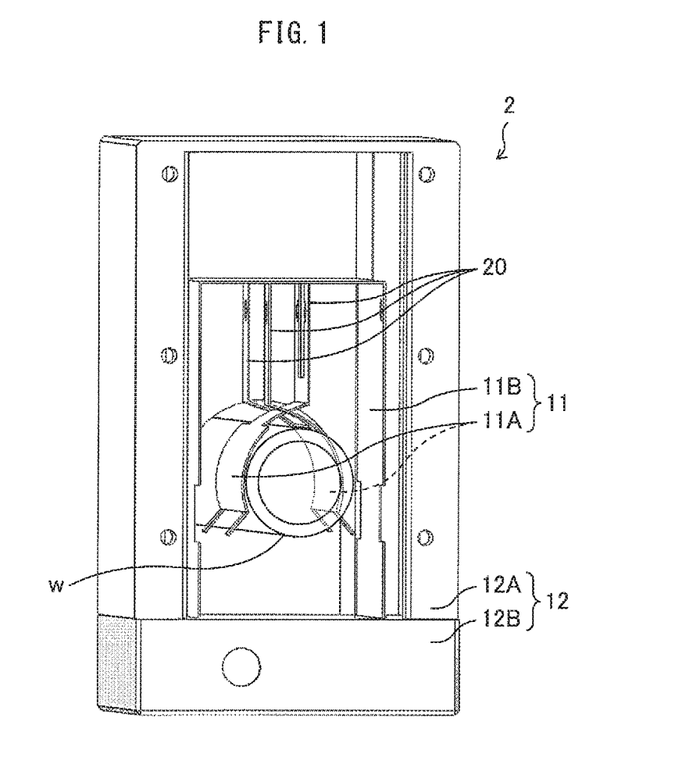
FIG. 1 is an appearance view illustrating a voltage measuring device in accordance with Embodiment 1 of the present invention.
Figure 2:
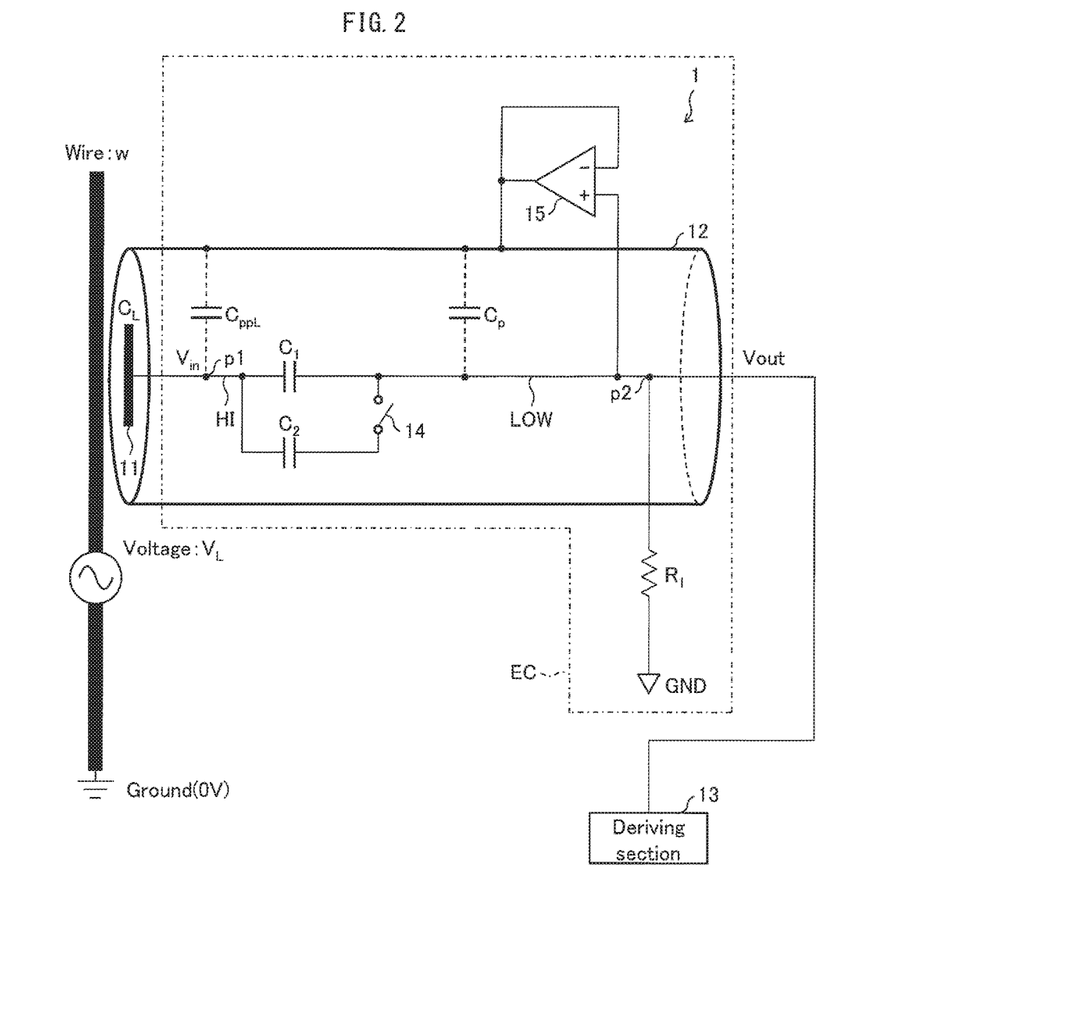
FIG. 2 is a schematic view illustrating a configuration of the voltage measuring device in accordance with Embodiment 1 of the present invention.

A configuration of a non-contact voltage measuring device 1 (hereinafter, merely referred to as a voltage measuring device 1) in accordance with Embodiment 1 will be described below with reference to FIGS. 1 and 2. FIG. 1 is an appearance view illustrating the voltage measuring device 1. FIG. 2 is a schematic view illustrating the configuration of the voltage measuring device 1. The voltage measuring device 1 is capable of measuring, without being in contact with a conducting wire contained in a wire "w" (primary wire, conductor) which can have various diameters (for example, diameters of 11 mm to 16 mm), a measurement target voltage $V_L$ which is a voltage that causes an alternating current (frequency: "f") to flows through the conducting wire.

As illustrated in FIG. 2, the voltage measuring device 1 includes a detecting probe 11 (probe), an electric field shield 12, a deriving section 13, and an electric circuit EC.

As illustrated in FIG. 1, the detecting probe 11, which is a sensor for detecting a measurement target voltage $V_L$, includes two detecting electrodes (an inner electrode 11A (first electrode) and an outer electrode 11B (second electrode)). The inner electrode 11A and the outer electrode 11B are electrically connected to each other via a connecting section 20. The outer electrode 11B is fixed to the electric field shield 12. Each of the inner electrode 11A and the outer electrode 11B is insulated from the electric field shield 12.

The inner electrode 11A, which is a movable electrode, is made up of two plate springs. A wire "w" is placed between the two plate springs. The two plate springs hold the wire "w" so as to be in close contact with the wire "w." The inner electrode 11A is elastically deformable depending on a diameter of the wire "w" so as to be in close contact with the wire "w." As the inner electrode 11A becomes closer to the wire "w," a capacitance value of a coupling capacitance $C_L$ formed between the inner electrode 11A and the wire "w" becomes higher.

An induced voltage is induced in the inner electrode 11A by an alternating current flowing through the wire "w." The induced voltage which is induced in the inner electrode 11A is also induced in the outer electrode 11B connected to the inner electrode 11A via the connecting section 20. The induced voltage (input voltage $V_{in}$) induced in each of the inner electrode 11A and the outer electrode 11B is supplied to the electric circuit EC electrically connected to the outer electrode 11B (see FIG. 2).

As the capacitance value of the coupling capacitance $C_L$ becomes higher, an amplitude of a voltage signal based on the input voltage $V_{in}$ supplied from the detecting probe 11 to the electric circuit EC becomes higher. This causes noise in the voltage signal to become relatively lower. Furthermore, this causes an improvement in accuracy of a measurement target voltage $V_L$ calculated in accordance with an electric signal outputted from the electric circuit EC. Therefore, as the capacitance value of the coupling capacitance $C_L$ becomes higher, an error of the measurement target voltage $V_L$ becomes smaller.

In a case where the induced voltage is induced in each of the inner electrode 11A and the outer electrode 11B, an electric field is generated between the inner electrode 11A and the electric field shield 12 and between the outer electrode 11B and the electric field shield 12.

Figure 4:
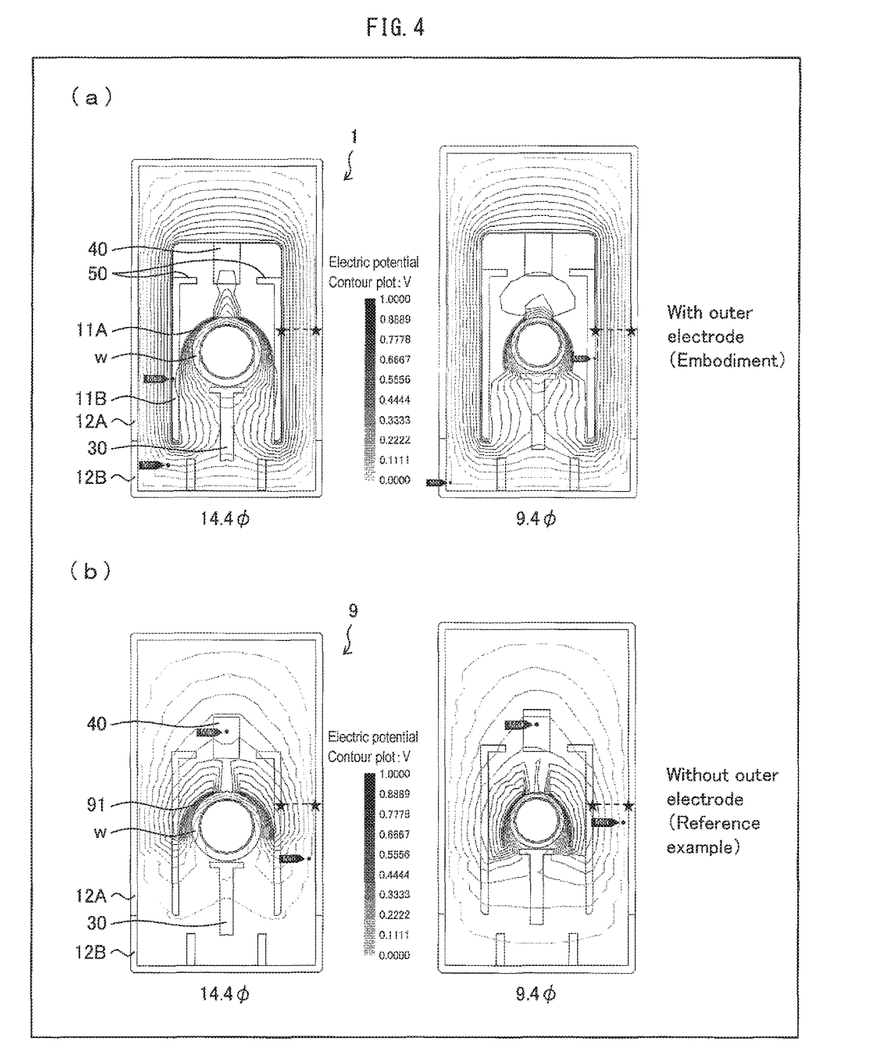

Note that the voltage measuring device 1 further includes resin structures 30, 40, and 50 (not illustrated in FIG. 1, see (a) of FIG. 4). Each of the resin structures 30, 40, and 50 retains the wire "w," the outer electrode 11B, the connecting section 20, or the like.

Figure 3:
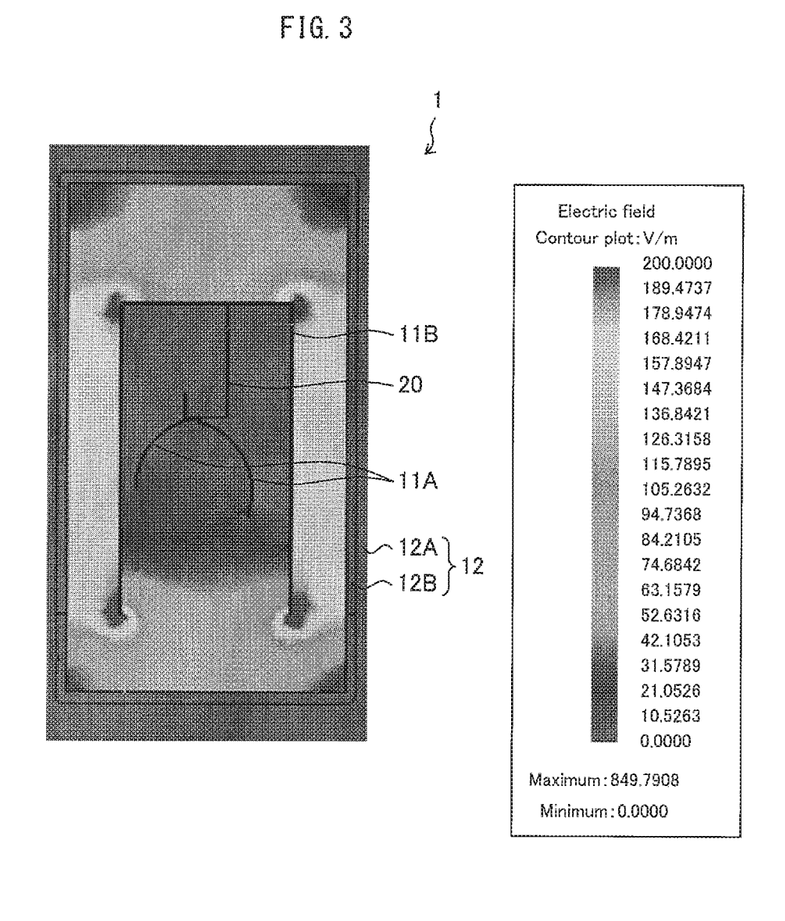
FIG. 3 is a contour plot illustrating a result of simulating electric fields generated in the voltage measuring device in accordance with Embodiment 1 of the present invention.

FIG. 3 is a contour plot illustrating a result of simulating electric fields generated in the voltage measuring device 1. According to this simulation, a given electric potential which is on an assumption that an electric potential of the electric field shield 12 is a reference (0 (zero) V) is given to each of the inner electrode 11A and the outer electrode 11B. Note that, according to this simulation, an electric field generated by the wire "w" is not taken into consideration.

As illustrated in FIG. 3, intensity of an electric field generated between the inner electrode 11A and the electric field shield 12 is lower than that of an electric field generated between the outer electrode 11B and the electric field shield 12. This is because the electric field generated by the inner electrode 11A is shielded by the outer electrode 11B provided between the inner electrode 11A and the electric field shield 12.

This causes a capacitance value of a parasitic capacitance formed between the inner electrode 11A and the electric field shield 12 to be lower than that of a parasitic capacitance formed between the outer electrode 11B and the electric field shield 12. Therefore, a capacitance value of a parasitic capacitance $C_{ppL}$ formed between the detecting probe 11 and the electric field shield 12 depends almost only on the capacitance value of the parasitic capacitance formed between the outer electrode 11B and the electric field shield 12.

The electric circuit EC obtains an induced voltage induced in the detecting probe 11 (the inner electrode 11A and the outer electrode 11B), as an input voltage $V_{in}$ at an input point p1. The electric circuit EC supplies, to the deriving section 13, a voltage at a detecting point p2 which is set in the electric circuit EC, as an output voltage $V_{out}$.

The electric circuit EC includes (i) a high impedance part HI which has a relatively high impedance value and (ii) a low impedance part LOW which has a relatively low impedance value. Note that the electric circuit EC will be later described in detail.

The electric field shield 12 prevents the electric circuit EC from being capacitive-coupled with a voltage source other than a wire, by shielding the electric circuit EC from an electric field incident on the electric circuit EC. The electric field shield 12 can be made of metal (shield metal).

As illustrated in FIG. 1, the electric field shield 12 is made up of an upper shield 12A and a lower shield 12B. The outer electrode 11B of the detecting probe 11 is fixed to an inner side of the upper shield 12A. The lower shield 12B is removable from the upper shield 12A.

A user causes the inner electrode 11A to hold a wire "w," and then attaches the lower shield 12B to the upper shield 12A. The user can replace the wire "w," held by the inner electrode 11A, with another wire by removing the lower shield 12B.

Note that the electric field shield 12 can include (i) a first electric field shielding section that covers part of the electric circuit EC which part has an electric potential identical that of the input point p1 (high impedance part HI) and (ii) a second electric field shielding section that covers part of the electric circuit EC which part has an electric potential identical to that of the detecting point p2 (low impedance part LOW). According to this configuration, the first electric field shielding section is insulated from the second electric field shielding section.

As illustrated in FIG. 2, a parasitic capacitance $C_{ppL}$ is formed between the electric field shield 12 and the high impedance part HI. Further, a parasitic capacitance $C_p$ is formed between the electric field shield 12 and the low impedance part LOW.

The deriving section 13 derives a measurement target voltage $V_L$ in accordance with an output voltage $V_{out}$ outputted from the electric circuit EC. Specifically, the deriving section 13 derives a measurement target voltage $V_L$ in accordance with the following expression.

$$V_L = \frac{\frac{1}{j\omega}\left(\frac{1}{C_2} - \frac{1}{C_1}\right)v_{out1}v_{out2}/R_1}{\left(1 + \frac{C_{ppL}}{C_1}\right)v_{out1} - \left(1 + \frac{C_{ppL}}{C_2}\right)v_{out2}} \quad \text{[Math. 1]}$$

Note here that $V_{out1}$ denotes an output voltage $V_{out}$ outputted in a case where the electric circuit EC is in a first state (later described) and that $V_{out2}$ denotes an output voltage $V_{out}$ outputted in a case where the electric circuit EC is in a second state (later described). Note that $\omega=2\pi f$ ("f" denotes a frequency of an alternating current flowing through a wire). Note also that a parasitic capacitance $C_p=0$ (zero). The parasitic capacitance $C_p$ is invalidated by an operational amplifier 15 (later described).

[Details of Electric Circuit EC]

The electric circuit EC will be described below in detail.

As illustrated in FIG. 2, the electric circuit EC includes capacitors $C_1$ and $C_2$, a detecting resistor $R_1$, a change-over switch 14, and the operational amplifier 15.

According to the electric circuit EC, each of the capacitors $C_1$ and $C_2$ is connected to the input point p1, to which an input voltage $V_{in}$ is supplied from the detecting probe 11. The detecting resistor $R_1$ is provided between (i) the capacitors $C_1$ and $C_2$ and (ii) a reference electric potential point GND. The detecting point p2, described earlier, is located between (i) the capacitors $C_1$ and $C_2$ and (ii) the detecting resistor $R_1$.

An input voltage $V_{in}$ supplied from the detecting probe 11 to the electric circuit EC is divided into voltages which are to be applied to the capacitors $C_1$ and $C_2$ and the detecting resistor $R_1$. An output voltage $V_{out}$ is equivalent to one of the voltages into which the input voltage $V_{in}$ is divided and which one is applied to the detecting resistor $R_1$.

A capacitance value of each of the capacitors $C_1$ and $C_2$ and a resistance value of the detecting resistor $R_1$ are determined so that the output voltage $V_{out}$ is sufficiently low. For example, in a case where (i) a capacitance value of a coupling capacitance $C_L$ is 10 pF, (ii) a measurement target voltage $V_L$ is 100 V, (iii) the capacitance value of the capacitor $C_1$ is 470 pF, (iv) the capacitance value of the capacitor $C_2$ is 47 pF, and (v) the resistance value of the detecting resistor $R_1$ is 1 (one) MΩ, the output voltage $V_{out}$ is tens of millivolts to hundreds of millivolts (in a case where f=50 Hz). In this case, it is possible to carry out measurement with use of a general voltmeter.

The change-over switch 14 switches the electric circuit EC between (i) the first state in which the capacitor $C_1$ is series-connected between a position where the coupling capacitance $C_L$ is formed and a position where the detecting resistor $R_1$ is formed and (ii) the second state in which the capacitors $C_1$ and $C_2$ are series-connected between and the position where the coupling capacitance $C_L$ is formed and the position where the detecting resistor $R_1$ is formed.

In a case where the electric circuit EC is in the first state, the input voltage $V_{in}$ is divided into voltages which are to be applied to the detecting resistor $R_1$ and the capacitor $C_1$. Meanwhile in a case where the electric circuit EC is in the second state, the input voltage $V_{in}$ is divided into voltages which are to be applied to the detecting resistor $R_1$ and the capacitors $C_1$ and $C_2$.

Note that the change-over switch 14 can be alternatively configured so as to switch the electric circuit EC between (i) the first state in which the capacitor $C_1$ is series-connected between the position where the coupling capacitance $C_L$ is formed and the position where the detecting resistor $R_1$ is formed and (ii) the second state in which the capacitor $C_2$ is series-connected between the position where the coupling capacitance $C_L$ is formed and the position where the detecting resistor $R_1$ is formed. Such a configuration can be realized, for example, by providing, to the electric circuit EC, (i) a switch between the input point p1 and the capacitor $C_1$ and (ii) a switch between the input point p1 and the capacitor $C_2$, each of those switches being capable of switching between on and off.

Hereinafter, part of the electric circuit EC which part has an electric potential identical to that of the input point p1 will be referred to as a high impedance part HI, and part of the electric circuit EC which part has an electric potential identical to that of the detecting point p2 will be referred to as a low impedance part LOW.

The low impedance part LOW of the electric circuit EC is connected to the electric field shield 12 via the operational amplifier 15. The operational amplifier 15 functions so that the electric field shield 12 has an electric potential identical to that of the low impedance part LOW. This is one of circuit techniques which is a so-called driven shield.

The operational amplifier 15 thus causes the low impedance part LOW of the electric circuit EC to have an electric potential identical to that of the electric field shield 12. This causes an electric current not to flow through a parasitic capacitance $C_p$ formed between the low impedance part LOW and the electric field shield 12. Therefore, it is possible to eliminate a possibility that the parasitic capacitance $C_p$ adversely affects a detected value of the output voltage $V_{out}$. Note that, in another embodiment, the voltage measuring device 1 can be configured such that (i) a voltage, equivalent to a voltage (output voltage $V_{out}$) at the low impedance part LOW, is generated from a voltage (input voltage $V_{in}$) at the high impedance part HI and (ii) the voltage thus generated is applied to the electric field shield 12.

Note that the voltage measuring device 1 can be configured so as not to include the operational amplifier 15.

[Verification of Effects: Electromagnetic Field Simulation]

As has been described, the voltage measuring device 1 is configured such that an electric field generated by the inner electrode 11A is shielded by the outer electrode 11B.

Therefore, an electromagnetic field generated outside the outer electrode 11B, that is, an electromagnetic field generated between the outer electrode 11B and the electric field shield 12 depends merely on an electric field generated by the outer electrode 11B, and is not affected by the electric field generated by the inner electrode 11A. Therefore, even in a case where the inner electrode 11A is deformed so that the electric field generated by the inner electrode 11A is changed, the electromagnetic field generated between the outer electrode 11B and the electric field shield 12 is not changed.

Here, a result of simulating electromagnetic fields generated in the voltage measuring device 1 will be shown for verification of this effect.

In this simulation, each of the inner electrode 11A and the outer electrode 11B was set to have an electric potential of 1 (one) V. Further, each of a wire "w" and the electric field shield 12 was set to have an electric potential of 0 (zero) V. The wire "w" was set to have a diameter of 14.4 φ (14.4 mm) and a diameter of 9.4 φ (9.4 mm). Under each of (i) a condition that the wire "w" had a diameter of 14.4 φ and (ii) a condition that the wire "w" had a diameter of 9.4 φ, electric potentials and electric fields in the voltage measuring device 1 were calculated. Depending on the diameter of the wire "w," a shape of the inner electrode 11A, which was located close to the wire "w," was changed.

Furthermore, electric potentials and electric fields generated in a voltage measuring device 9 in accordance with a reference example were simulated for comparison with the above calculation results. Note that the voltage measuring device 9 includes only a single electrode 91, which corresponds to the inner electrode 11A of the voltage measuring device 1. That is, the voltage measuring device 9 is different from the voltage measuring device 1 in that the outer electrode 11B is not provided (see (b) of FIG. 4).

(1. Simulation Result: Electric Potential)

(a) and (b) of FIG. 4 are contour plots each illustrating a result of simulating electric potentials generated in the voltage measuring device 1. A left plot in (a) of FIG. 4 illustrates electric potentials generated in a case where the wire "w" has a diameter of 14.4 φ (14.4 mm), while a right plot in (a) of FIG. 4 illustrates electric potentials generated in a case where the wire "w" has a diameter of 9.4 φ (9.4 mm). Meanwhile, (b) of FIG. 4 are contour plots each illustrating a result of simulating electric potentials generated in the voltage measuring device 9.

According to the voltage measuring device 1, there is no equipotential line between the inner electrode 11A and the outer electrode 11B (see (a) of FIG. 4). Further, between the outer electrode 11B and the electric field shield 12, intervals between equipotential lines and a shape of each of the equipotential lines do not depend on the diameter of the wire "w". In other words, between the outer electrode 11B and the electric field shield 12, the intervals between the equipotential lines and the shape of each of the equipotential lines do not depends on the shape of the inner electrode 11A.

Figure 5:
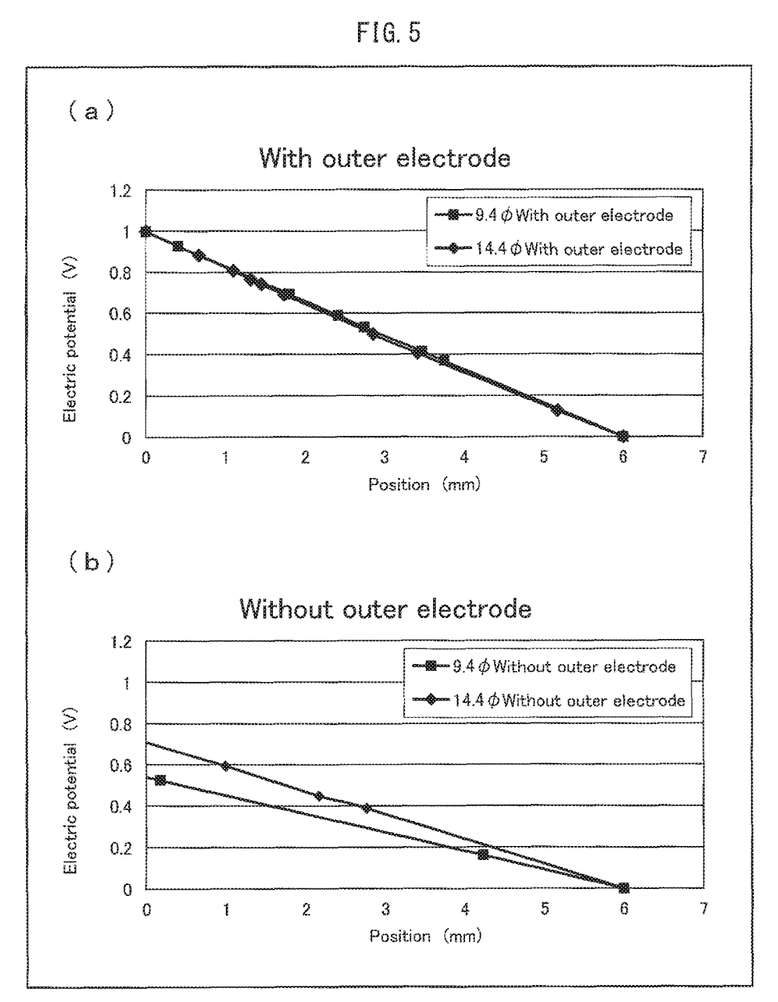

(a) of FIG. 5 is a graph illustrating electric potentials (V) in ranges indicated by respective broken lines illustrated in (a) of FIG. 4 (each of the ranges being a range from the outer electrode 11B to the upper shield 12A). (b) of FIG. 5 is a graph illustrating electric potentials (V) in ranges indicated by respective broken lines illustrated in (b) of FIG. 4. The ranges, indicated by the respective broken lines in (a) of FIG. 4, of the voltage measuring device 1 correspond to the ranges, indicated by the respective broken lines in (b) of FIG. 4, of the voltage measuring device 9.

As is clear from (a) of FIG. 5, according to the voltage measuring device 1, a level of an electric potential (V) does not depend on a diameter of a wire "w," in a range from a position (0 (zero) mm) of the outer electrode 11B to a position (6 mm) of the upper shield 12A. That is, the level of the electric potential (V) in this range does not depend on the shape of the inner electrode 11A.

On the other hand, as is clear from (b) of FIG. 5, according to the voltage measuring device 9, a level of an electric potential (V) depends on the shape of the inner electrode 91, in the same range (0 (zero) mm to 6 mm).

(2. Simulation Result: Electric Field)

Figure 6:
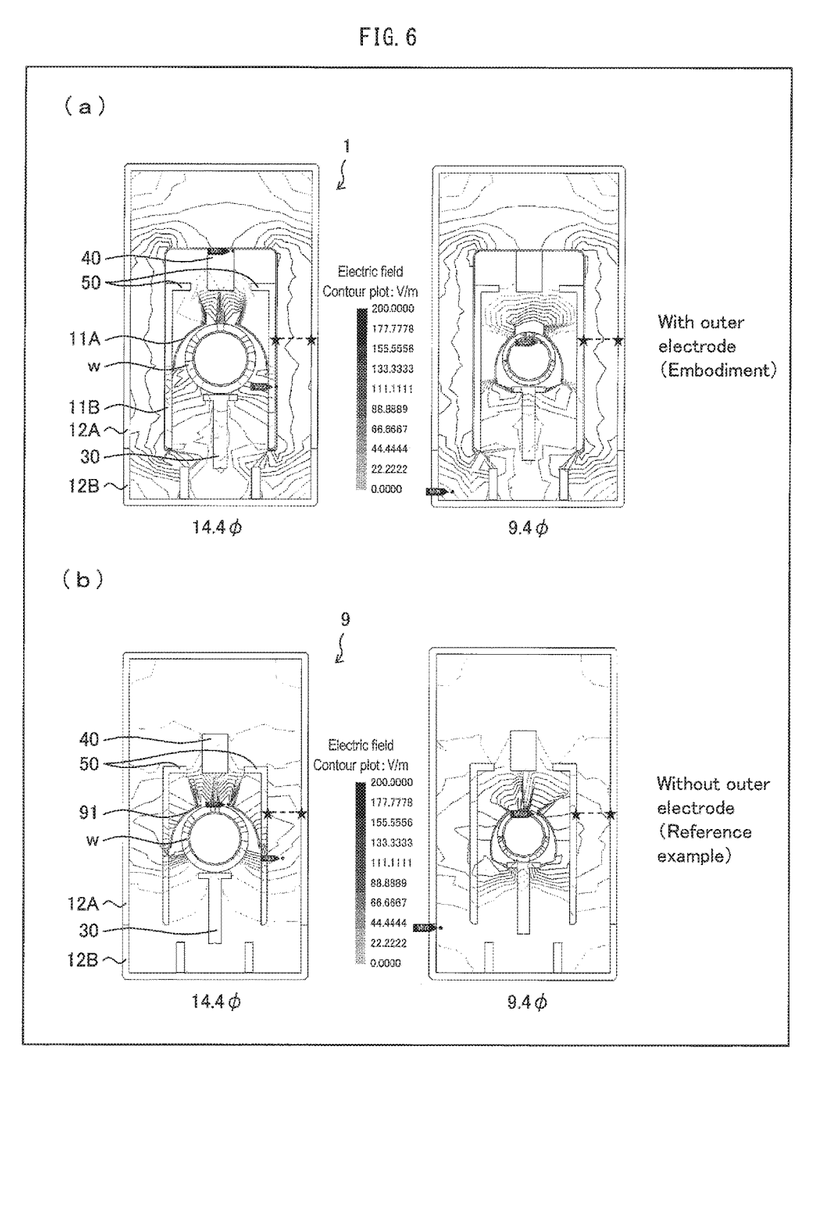

(a) of FIG. 6 are contour plots each illustrating a result of simulating electric fields generated in the voltage measuring device 1. (b) of FIG. 6 are contour plots each illustrating a result of simulating electric fields generated in the voltage measuring device 9.

As is clear from (a) of FIG. 6, between the outer electrode 11B and the electric field shield 12, intervals between equipotential lines and a shape of each of the equipotential lines do not depend on the shape of the inner electrode 11A.

Figure 7:
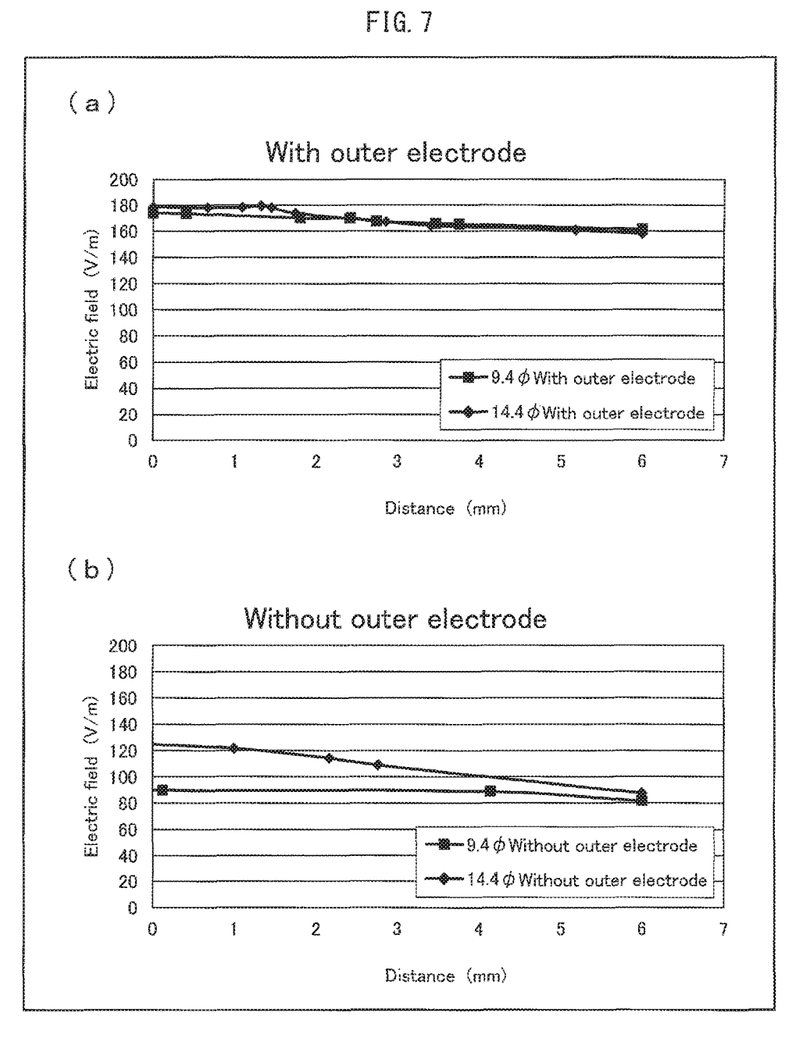

(a) of FIG. 7 is a graph illustrating electric fields (V/m) in ranges indicated by respective broken lines illustrated in (a) of FIG. 6 (each of the ranges being a range from the outer electrode 11B to the upper shield 12A). (b) of FIG. 7 is a graph illustrating electric fields (V/m) in ranges indicated by respective broken lines illustrated in (b) of FIG. 6. The ranges indicated by the respective broken lines in (a) of FIG. 6 correspond to the ranges indicated by the respective broken lines in (b) of FIG. 6.

As is clear from (a) of FIG. 7, according to the voltage measuring device 1, intensity of an electric field (V/m) does not depend on a diameter of a wire "w," in the range from the position (0 (zero) mm) of the outer electrode 11B to the position (6 mm) of the upper shield 12A. That is, the intensity of the electric field (V/m) in this range does not depend on the shape of the inner electrode 11A.

On the other hand, as is clear from (b) of FIG. 7, according to the voltage measuring device 9, intensity of an electric field (V/m) depends on the shape of the inner electrode 91, in the same range (0 (zero) mm to 6 mm).

It is found from the graph illustrated in each of (a) of FIG. 5 and (a) of FIG. 7 that, according to the voltage measuring device 1, strength of coupling between the electric field shield 12 and the outer electrode 11B is uniform, regardless of the shape of the inner electrode 11A. This means that, even in a case where the inner electrode 11A is deformed, a capacitance value of a parasitic capacitance $C_{ppL}$ formed between the detecting probe 11 and the electric field shield 12 is not changed.

Embodiment 2

Figure 8:
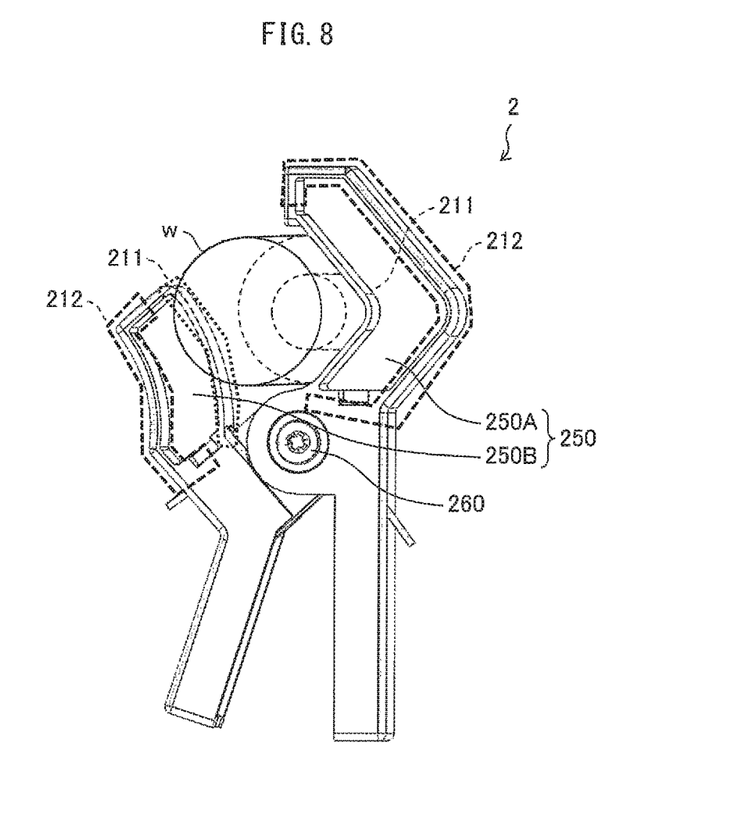
FIG. 8 is an appearance view illustrating a configuration of a non-contact voltage measuring device in accordance with Embodiment 2 of the present invention.

The following description will discuss Embodiment 2 of the present invention with reference to FIG. 8. Note that, for convenience, identical reference signs will be given to respective members having functions identical to those of the members described in Embodiment 1, and descriptions thereof will be omitted.

In Embodiment 1, the detecting probe 11 has been described which is configured such that it includes the outer electrode 11B, which is fixed to the electric field shield 12, in addition to the inner electrode 11A, which is deformable depending on a size of a wire "w" (see FIG. 1). Alternatively, a detecting probe can be configured such that (i) it includes merely a single electrode and (ii) the single electrode is deformable or movable while causing a capacitance value of a parasitic capacitance $C_{ppL}$ formed between the single electrode and an electric field shield to be maintained at a given level.

In Embodiment 2, a configuration will be described below in which an electrode of a detecting probe is moved while a relative position of the electrode with respect to an electric field shield is being maintained. According to this configuration, since a distance between the electrode and the electric field shield remains unchanged, a capacitance value of a parasitic capacitance $C_{ppL}$ formed between the electrode and the electric field shield is maintained at a given level.

FIG. 8 is an appearance view illustrating a configuration of a detecting probe 21 in accordance with Embodiment 2. As illustrated in FIG. 8, the detecting probe 21 includes a clamp section 250 (deformable section) made up of two arms (a first arm 250A and a second arm 250B). The clamp section 250 is capable of holding, between the first arm 250A and the second arm 250B, various wires "w" having respective different diameters.

As illustrated in FIG. 8, the first arm 250A and the second arm 250B are joined to each other via a joining section 260. For example, a coil spring can serve as the joining section 260. The first arm 250A and the second arm 250B are each capable of turning on the joining section 260. The joining section 260 applies, to each of the first arm 250A and the second arm 250B, a force that acts in a direction in which a distance between the first arm 250A and the second arm 250B is reduced.

An electrode 211 and an electric field shield 212 are provided to each of the first arm 250A and the second arm 250B. Those two electrodes 211 are electrically connected to each other. Further, those two electric field shields 212 are each connected to a reference electric potential point (GND). Note that merely one of the first arm 250A and the second arm 250B can be alternatively provided with the electrode 211 and the electric field shield 212.

While a wire "w" is being held by the clamp section 250, the electrode 211 provided to each of the first arm 250A and the second arm 250B is located close to the wire "w." This causes a coupling capacitance $C_L$ to be formed between the electrode 211 and the wire "w." An induced voltage is induced in the electrode 211 by an alternating current flowing through the wire "w."

At least one of the first arm 250A and the second arm 250B embeds therein an electric circuit EC (not illustrated in FIG. 8, see FIG. 2) which is covered by the electric field shield 212. The electrode 211 is electrically connected to the electric circuit EC. The induced voltage induced in the electrode 211 is supplied to the electric circuit EC as an input voltage $V_{in}$. The electric circuit EC supplies, to a deriving section 13 (see FIG. 2), an output voltage $V_{out}$ that is equivalent to one of voltages into which the input voltage $V_{in}$ is divided and which one is applied to a detecting resistor $R_1$. The deriving section 13 derives a measurement target voltage $V_L$ in accordance with the output voltage $V_{out}$ outputted from the electric circuit EC. Note that the deriving section 13 can be provided inside the detecting probe 21 or can be alternatively provided outside the detecting probe 21.

According to the configuration of the detecting probe 21, the electrode 211 and the electric field shield 212 are provided to each of the first arm 250A and the second arm 250B. Therefore, even in a case where each of the first arm 250A and the second arm 250B is moved depending on a diameter of a wire "w" held by the clamp section 250, respective relative positions of the electrode 211 and the electric field shield 212 with respect to each other are maintained. To be precise, the respective relative positions of the electrode 211 and the electric field shield 212 each provided to the first arm 250A are maintained with respect to each other, whereas the respective relative positions of the electrode 211 and the electric field shield 212 each provided to the second arm 250B are maintained with respect to each other.

Therefore, a capacitance value of a parasitic capacitance $C_{ppL}$ formed between the electrode 211 and the electric field shield 212 is maintained at a given level.

[Supplements]

As has been described, as a capacitance value of a coupling capacitance $C_L$ becomes higher, an error of a measurement target voltage $V_L$ becomes lower. Reasons for this phenomenon will be theoretically described below.

According to the electric circuit EC illustrated in FIG. 2, a measurement target voltage $V_L$ is represented by the following expressions.

[Math. 2]

$$V_L = \frac{1}{j\omega C_L}I_n + \frac{1}{j\omega C_n}I_n + RI_n \quad (C_n : C_1 \text{ or } C_2^n(= C_1 + C_2)) \quad (1)$$

$$Vout_n = RI_n \Rightarrow I_n = \frac{Vout_n}{R} \quad (2)$$

Here, it is assumed that, in a case where the electric circuit EC is in the first state, an electric current and an output voltage each supplied to the deriving section 13 are represented by $I_1$ and $V_{out1}$, respectively. Meanwhile, it is assumed that, in a case where the electric circuit EC is in the second state, an electric current and an output voltage each supplied to the deriving section 13 are represented by $I_2$ and $V_{out2}$, respectively. Further, it is assumed that a capacitance value of the capacitor $C_2$ is sufficiently higher than that of the capacitor $C_1$ ($C_1 \ll C_2$).

In a case where Expression (2) is substituted into Expression (1), the following is obtained:

$$V_L = \left(\frac{1}{j\omega C_L} + \frac{1}{j\omega C_n}\right)\frac{Vout_n}{R} + Vout_n \quad \text{[Math. 3]}$$

$$= \frac{j\omega(C_L + C_n)}{j\omega C_L \cdot j\omega C_n} \cdot \frac{1}{R} \cdot Vout_n + Vout_n$$

$$= \left(\frac{j\omega(C_L + C_n)}{(j\omega)^2 \cdot C_L \cdot C_n} \cdot \frac{1}{R} + 1\right) Vout_n$$

$$= \left(\frac{C_L + C_n}{j\omega \cdot C_L \cdot C_n} \cdot \frac{1}{R} + 1\right) \cdot Vout_n$$

Therefore, $$V_L\left(1 - j\frac{C_L + C_n}{\omega \cdot C_L \cdot C_n \cdot R}\right) \cdot Vout_n \quad \text{[Math. 4]}$$

$$|V_L| = \sqrt{\left(1 + \frac{(C_L + C_n)^2}{\omega^2 \cdot C_L^2 \cdot C_n^2 \cdot R^2}\right)} \cdot |Vout_n| \quad \text{[Math. 5]}$$

$$|V_L|^2 = \left(1 + \frac{(C_L + C_n)^2}{\omega^2 \cdot C_L^2 \cdot C_n^2 \cdot R^2}\right) \cdot |Vout_n|^2 \quad \text{[Math. 6]}$$

$$= \left(1 + \frac{1}{\omega^2 \cdot C_n^2 \cdot R^2} + \frac{2}{\omega^2 \cdot C_L \cdot C_n \cdot R^2} + \frac{1}{\omega^2 \cdot C_L^2 \cdot R^2}\right) \cdot |Vout_n|^2.$$

Therefore, $$\frac{d|V_L|^2}{dC_L} = -2\left(\frac{1}{\omega^2 \cdot C_L^2 \cdot C_n \cdot R^2} + \frac{1}{\omega^2 \cdot C_L^3 \cdot R^2}\right) \cdot |Vout_n|^2 \quad \text{[Math. 7]}$$

Therefore, $$\therefore C_L \to \infty \quad \frac{d|V_L|^2}{dC_L} = 0 \quad \text{[Math. 8]}$$

Figure 9:
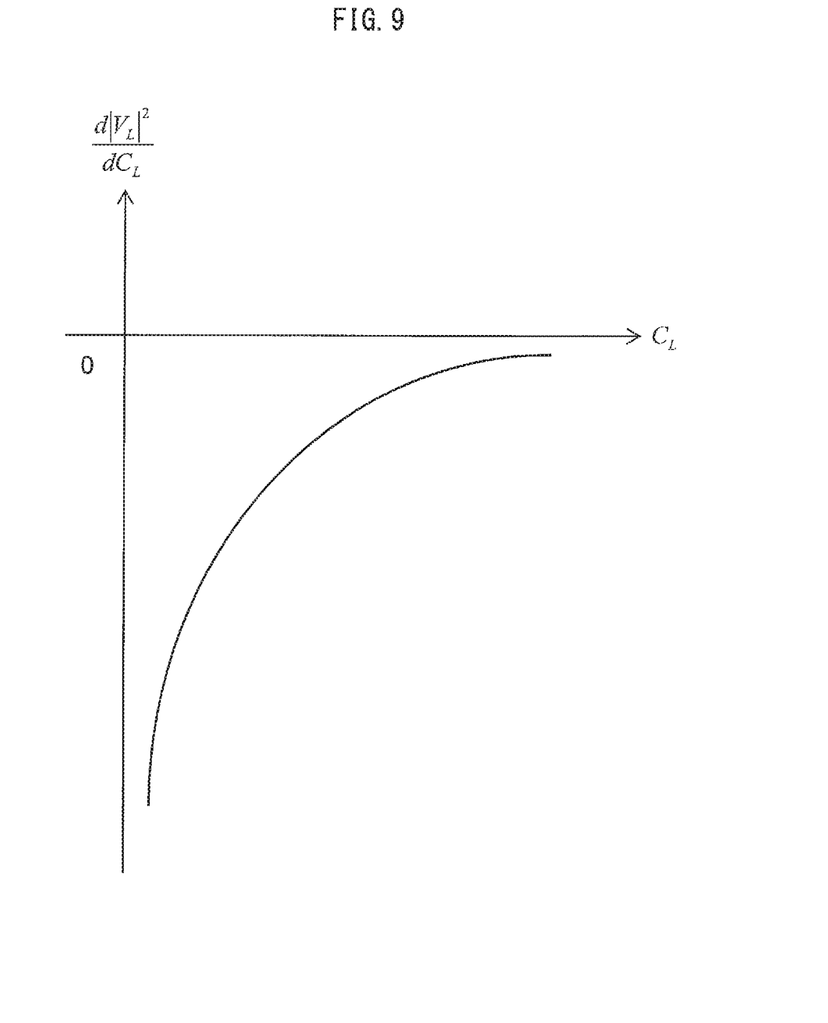
FIG. 9 is a graph illustrating a relationship between a coupling capacitance and a measurement target voltage, that is, a relationship between (i) a capacitance value of a coupling capacitance and (ii) a second order differential value of an absolute value of a measurement target voltage.

FIG. 9 is a graph illustrating a relationship between a coupling capacitance $C_L$ and a second order differential value of an absolute value of a measurement target voltage $V_L$, that is, $d|V_L|^2/dC_L$. As is clear from the graph illustrated in FIG. 9, as a capacitance value of a coupling capacitance $C_L$ becomes higher, a variation in $d|V_L|^2/dC_L$ becomes smaller. It is theoretically derived from this fact that, as a capacitance value of a coupling capacitance $C_L$ becomes higher, a variation and an error of a measured value of a measurement target voltage $V_L$ becomes smaller.

The present invention is not limited to the embodiments, but can be altered by a skilled person in the art within the scope of the claims. An embodiment derived from a proper combination of technical means each disclosed in a different embodiment is also encompassed in the technical scope of the present invention.

[Summary]

As has been described, a non-contact voltage measuring device in accordance with an aspect of the present invention is a non-contact voltage measuring device for measuring a measurement target voltage applied to a conductor, including: a probe; an electric circuit; and an electric field shield which covers at least part of the electric circuit so as to shield the electric circuit from an electric field incident on the electric circuit, the probe being deformable depending on a shape of the conductor, the probe causing a capacitance value of a parasitic capacitance formed between an electrode of the probe and the electric field shield to be maintained at a given level, the measurement target voltage being measured in accordance with a voltage signal supplied to the electric circuit via the probe in a case where the probe is brought closer to the conductor, without being in contact with the conductor, so that a coupling capacitance is formed between the electrode of the probe and the conductor.

According to the above configuration, the electrode included in the probe is deformable. Specifically, the electrode can be deformable so as to be close contact with an outer coating of a conducting wire (conductor). Further, even in a case where the electrode is deformed, the probe causes a capacitance value of a parasitic capacitance formed between the electrode and the electric field shield to be maintained at a given level.

Generally, an effect of a parasitic capacitance, formed between an electrode of a probe and an electric field shield, on accuracy of measurement of a measurement target voltage is eliminated by calibration. However, according to a conventional configuration, in a case where a degree of deformation of an electrode is changed, a distance between the electrode and an electric field shield is also changed. As a result, a capacitance value of a parasitic capacitance formed between the electrode and the electric field shield is also changed. Therefore, according to the conventional configuration, there is a problem that accuracy of measurement of a measurement target voltage is changed depending on a degree of deformation of the electrode.

In contrast, according to the above configuration, even in a case where a degree of deformation of the probe is changed, a capacitance value of a parasitic capacitance formed between the electrode and the electric field shield is not changed.

It is therefore possible to measure, with given accuracy, measurement target voltages applied to various conducting wires having respective different diameters.

The non-contact voltage measuring device in accordance with another aspect of the present invention can be arranged such that: the probe includes (i) a first electrode which is deformable depending on the shape of the conductor and (ii) a second electrode whose relative position with respect to the electric field shield is maintained; the first electrode is electrically connected to the second electrode; and the second electrode is provided at a position at which the second electrode is capable of shielding an electric field generated between the first electrode and the electric field shield.

According to the above configuration, the relative position of the second electrode of the probe is maintained with respect to the electric field shield. The first electrode of the probe is deformable depending on a shape of a conductor.

Even in a case where the first electrode is deformed, a distance between the second electrode and the electric field shield is not changed. Therefore, a capacitance value of a parasitic capacitance formed between the second electrode and the electric field shield is also not changed. Accordingly, no matter to what degree the first electrode is deformed, an amount of a leakage current following through the parasitic capacitance formed between the second electrode and the electric field shield is not changed.

Therefore, a total amount of the leakage current following through the parasitic capacitance formed between the second electrode and the electric field shield is uniform, regardless of a degree of deformation of the first electrode.

Furthermore, according to the above configuration, the second electrode is provided at a position at which the second electrode is capable of shielding an electric field generated between the first electrode and the electric field shield. Therefore, no leakage current flows through a parasitic capacitance formed between the first electrode and the electric field shield. This causes a reduction in total amount of a leakage current flowing between the probe and the electric field shield, and accordingly causes an improvement in accuracy of measurement of a measurement target voltage.

Moreover, according to the above configuration, the non-contact voltage measuring device can be arranged such that the second electrode is located closer to the electric field shield than the first electrode is.

According to this configuration, a capacitance value of a parasitic capacitance formed between the first electrode and the electric field shield is lower than that of a parasitic capacitance formed between the second electrode and the electric field shield. Accordingly, a ratio of the capacitance value of the parasitic capacitance formed between the first electrode and the electric field shield to a whole capacitance value of a parasitic capacitance formed between the probe and the electric field shield is lower. Therefore, in a case where a value of the parasitic capacitance formed between the first electrode and the electric field shield is changed, it is possible to suppress an effect of such a change on accuracy of measurement of a measurement target voltage.

The non-contact voltage measuring device in accordance with further another aspect of the present invention can be arranged such that: the probe includes a deformable section which is deformable depending on the shape of the conductor; the deformable section is made up of a plurality of arms which are joined to each other via a joining section and which turn on the joining section; and the electrode and the electric field shield are provided to at least one of the plurality of arms so as to be spaced out by a given distance.

According to the above configuration, the electrode and the electric field shield are provided to at least one of the plurality of arms of the deformable section, which is deformable depending on a shape of a conductor. In a case where the deformable section is deformed, the plurality of arms of the deformable section are moved. The electrode and the electric field shield are provided to an identical one of the plurality of arms so as to be spaced out by a given distance. It is therefore possible to maintain a relative position of the electrode with respect to the electric field shield, in a case where the plurality of arms are moved.

No matter to what degree the plurality of arms are moved, an amount of a leakage current flowing through a parasitic capacitance formed between the electrode and the electric field shield is not changed. It is therefore possible to measure a measurement target voltage with given accuracy, regardless of an amount of movement of the plurality of arms.

INDUSTRIAL APPLICABILITY

The present invention can be used for a voltage measuring device which measures a voltage that causes an alternating current to flow through a conducting wire contained in a wire subjected to insulating coating, without being in contact with the conducting wire.

REFERENCE SIGNS LIST w Wire (conductor)
EC Electric circuit
$V_L$ Measurement target voltage
1 Non-contact voltage measuring device
11 Detecting probe (probe)
21 Detecting probe (probe)
211 Electrode
11A Inner electrode (first electrode)
11B Outer electrode (Second electrode)
12 Electric field shield
212 Electric field shield
250 Clamp section (deformable section)
250A First arm (arm)
250B Second arm (arm)
260 Joining section

The invention claimed is:
1. A non-contact voltage measuring device for measuring a measurement target voltage applied to a conductor, comprising:
    a probe;
    an electric circuit; and
    an electric field shield which covers at least part of the electric circuit so as to prevent an electric field from being incident to the electric circuit,
    the probe including (i) a first electrode which is elastically deformable in accordance with a shape of the conductor and (ii) a second electrode which causes a capacitance value of a parasitic capacitance formed between the second electrode and the electric field shield to be maintained at a given level by maintaining a relative position of the second electrode with respect to the electric field shield even in a case where the first electrode is deformed,
    the first electrode being electrically connected to the second electrode;
    the second electrode being provided at a position at which the second electrode is capable of shielding an electric field generated between the first electrode and the electric field shield,
    the measurement target voltage being measured in accordance with a voltage signal supplied to the electric circuit via the probe in a case where the probe is brought closer to the conductor, without being in contact with the conductor, so that a coupling capacitance is formed between the probe and the conductor.

* * * * *